United States Patent
Conley et al.

(10) Patent No.: US 6,266,273 B1
(45) Date of Patent: Jul. 24, 2001

(54) METHOD AND STRUCTURE FOR RELIABLE DATA COPY OPERATION FOR NON-VOLATILE MEMORIES

(75) Inventors: Kevin M. Conley, San Jose; Daniel C. Guterman, Fremont; Carlos J. Gonzalez, Los Gatos, all of CA (US)

(73) Assignee: Sandisk Corporation, Sunnyvale, CA (US)

( * ) Notice: Subject to any disclaimer, the term of this patent is extended or adjusted under 35 U.S.C. 154(b) by 0 days.

(21) Appl. No.: 09/643,151

(22) Filed: Aug. 21, 2000

(51) Int. Cl.[7] .................................................. G11C 16/04
(52) U.S. Cl. ........................ 365/185.11; 365/185.04; 365/185.09
(58) Field of Search ...................... 365/185.11, 185.09, 365/189.04, 185.22

(56) References Cited

U.S. PATENT DOCUMENTS

| | | | |
|---|---|---|---|
| 5,768,194 | * 6/1998 | Matsubara et al. | 365/185.23 |
| 5,890,192 | 3/1999 | Lee et al. | 711/103 |
| 5,930,167 | * 7/1999 | Lee et al. | 365/185.03 |
| 6,040,997 | 3/2000 | Estakhri | 365/189.05 |
| 6,181,598 | * 1/2001 | Matsubara et al. | 365/185.11 |

* cited by examiner

Primary Examiner—Vu A. Le
Assistant Examiner—Tuan T. Nguyen
(74) Attorney, Agent, or Firm—Steven F. Caserza; Flehr Hohbach Test Albritton & Herbert LLP

(57) ABSTRACT

An improved flash EEPROM memory-based storage subsystem includes one or more flash memory arrays, each with a duplicity of data registers and a controller circuit. When data are read from a flash array into a data register, the data is copied to a second register so that, during the ensuing program operation into the same array, the data may be transferred to the controller for the purpose of checking the data validity. This creates an improved performance system that doesn't suffer data transfer latency during copy operations but that is able to guarantee the validity of the data involved in such operations.

5 Claims, 5 Drawing Sheets

METHOD AND STRUCTURE FOR RELIABLE DATA COPY OPERATION FOR NON-VOLATILE MEMORIES

INTRODUCTION

1. Technical Field

This invention pertains to the field of semiconductor non-volatile memory architectures and their methods of operating, and has application to flash electrically erasable and programmable read-only memories (EEPROMs).

2. Background

A common application of flash EEPROM devices is as a mass data storage subsystem for electronic devices. Such subsystems are commonly implemented as either removable memory cards that can be inserted into multiple host systems or as non-removable embedded storage within the host system. In both implementations, the subsystem includes one or more flash devices and often a subsystem controller.

Flash EEPROM devices are composed of one or more arrays of transistor cells, each cell capable of non-volatile storage of one or more bits of data. Thus flash memory does not require power to retain the data programmed therein. Once programmed however, a cell must be erased before it can be reprogrammed with a new data value. These arrays of cells are partitioned into groups to provide for efficient implementation of read, program and erase functions. A typical flash memory architecture for mass storage arranges large groups of cells into erasable blocks. Each block is further partitioned into one or more addressable sectors that are the basic unit for read and program functions.

The subsystem controller performs a number of functions including the translation of the subsystem's logical block address (LBA) to a physical chip, block, and sector address. The controller also manages the low level flash circuit operation through a series of commands that it issues to the flash memory devices via an interface bus. Another function the controller performs is to maintain the integrity of data stored to the subsystem through various means (e.g. by using an error correction code, or ECC).

In the operation of such systems where the erase block contains multiple sectors, it can occasionally become necessary to copy the contents of one sector's data to another erased sector. This can occur, for example, when the data in a portion of a block's sectors are superseded by new data being written by the host to the subsystem, but the physical proximity of the original sector's new data to the other unaffected sectors' data within the block is to be maintained. FIG. 1 shows an example of how this can be done. The unaffected sectors' data are read from the original block and are subsequently programmed into erased sectors in another block. The new data from the host are likewise programmed into erased sectors in the new block. After the completion of these operations, the original block with superceded data is erased.

During such an operation as described above, it is necessary when using conventional flash memories to transfer the data from the memory being read and subsequently transfer it to the memory being programmed. These data transfer operations create a time latency equal to the size of the sector divided by the flash memory interface bus width multiplied by the cycle time of the bus. Very often these operations are performed on the same physical memory device.

To further illustrate the impact these data transfer latencies have on the overall operation, FIG. 1 is described here in more detail. Assume for the purposes of illustration that a block is comprised of sixteen sectors, each with incrementally assigned addresses sector 0 through sector 15, as shown in FIG. 1. For the example where it is desired to rewrite new data in sector 7 through sector 9 of the data block, the write sequence is as follows:

1. Assign an unused, erased block (erase block 1) for the sector program operation;
2. Select address of the original block, read sector 0 of the original block, transfer data from flash EEPROM to controller;
3. Select address of the newly assigned block, transfer data back to flash EEPROM and program in sector 0 of the newly assigned block;
4. Repeat steps 2 and 3 for sectors 1 through 6;
5. Select address of the newly assigned block, transfer new host data for page 7 to flash EEPROM and program into sectors in the newly assigned block;
6. Repeat step 5 for sectors 8 and 9;
7. Select address of the original block, read sector 10 of the original block, transfer data from flash EEPROM to controller;
8. Select address of the newly assigned block, transfer data back to flash EEPROM and program into sector 10 of the newly assigned block;
9. Repeat steps 7 and 8 for sectors 11 through 15; and
10. Erase the original (now superseded) block for future write operations.

FIG. 2 shows a typical prior art flash EEPROM device's internal architecture 4000. The key features include an I/O bus 411 and control signals 412 to interface to an external controller, a memory control circuit 450 to control internal memory operations with registers for command, address and status, one or more arrays 400 of flash EEPROM cells, each array with its own row decoder (XDEC) 401 and column decoder (YDEC) 402, a group of sense amplifiers and program control circuitry (SA/PROG) 454 and a Data Register 404.

If desired, a plurality of arrays 400, together with related X decoders, Y decoders, program/verified circuitry, data registers, and the like is provided, for example as taught by U.S. Pat. No. 5,890,192; issued Mar. 30, 1999, and assigned to Sandisk Corporation, the assignee of this application, and which is hereby incorporated by reference.

The external interface I/O bus 411 and control signals 412 could be configured with the following signals:

CS—Chip Select. Used to active flash memory interface.
RS—Read Strobe. Used to indicate AD bus is being used for a data read operation.
WS—Write Strobe. Used to indicate AD bus is being used for a data write operation.
AS—Address Strobe. Indicates that AD bus is being used to transfer address information.
AD[7:0]—Address/Data Bus Used to transfer data between controller and flash memory command, address and data registers.

This interface is given only as an example, as other signal configurations can be used to give the same functionality. Although this diagram shows only one flash memory array 400 with its related components, it is understood that a multiplicity of arrays can exist on a single flash memory chip that share a common interface and memory control circuitry but have separate XDEC, YDEC, SA/PROG and DATA REG circuitry in order to allow parallel read and program operations.

Data from the EEPROM system 4000 data register 404 to an external controller via the data registers coupling to the I/O bus AD[7:0] 411. The data register 404 is also coupled to the sense amplifier/programming circuit 454. The number of elements of the data register coupled to each sense amplifier/programming circuit element may depend on the number of bits stored in each flash EEPROM cell. Each flash EEPROM cell may include a plurality of bits, such as 2 or 4, if multi-state memory cells are employed.

Row decoder 401 decodes row addresses for array 400 in order to select the physical sector being accessed. Row decoder 401 receives row addresses via internal row address lines 419 from memory control logic 450. Column decoder 402 receives column addresses via internal column address lines 429 from memory control logic 450.

It is common practice that each sector's worth of host data programmed into a sector is appended with an Error Detection and Correction code (ECC) that could be used to determine the validity of the stored data. Some such systems would use the occasion of the transfer as an opportunity to check the validity of the data being read as a way to ensure that the data would be correctly programmed in the new location. Due to the overall fidelity of these storage devices, the occurrence of failure during such verifications is rare.

FIG. 3 shows a typical flash card architecture that has a single controller 301 that performs host and memory control functions and a flash memory array that is composed of one or more flash memory devices. The system controller and the flash memory are connected by bus 302 that allows controller 301 to load command, address, and transfer data to and from the flash memory array.

FIG. 4 shows a timing diagram of a page copy operation from a source address (SRC[N]) to a destination address (DST[N]). The READ Signal indicates that a read is taking place from the source sector. The XFER signal indicates a data transfer between the flash data register and the controller. The R/WB signal indicates the direction of the transfer (high being a read from the flash to the controller and low being write from the controller to the flash). The PROG signal indicates that a program operation is taking place upon the destination page.

Typical timing values:

$T_{RD}$=25 us $T_X$=26.4 us $T_{PRG}$=300 us $T_{ERA}$=500–3000 us (Not Shown)

So the total time to copy a single sector (as shown in FIG. 4).

$$T_{COPY}=T_{RD}+2*T_X+T_{PRG}=377\ us$$

Making the data transfer time 14% of the overall page copy operation.

It is a general trend in non-volatile memory design to increase the number of cells that can be programmed and read at one time in order to improve the write and read performance of these devices. This can be accomplished by increasing the number of memory cell arrays on a single die, increasing the page size within a single plane, programming multiple chips in parallel or some combination of these three techniques. The result of any of these is that the data transfer length must increase for the larger number of cells being programmed or read with the program and read times changing little or not at all. Thus, the expense of data copy in a system that has such increased parallelism is that much higher. As an example, the same timing values as used in the above example show the impact on a system with a four-fold increase in parallelism:

$$T_{COPY}=T_{RD}+8*T_X+T_{PRG}=536.2\ us$$

Making the data transfer time 39% of the overall four page copy operation.

U.S. Pat. No. 6,040,997 describes a technique known by the patentee and others in which a flash memory system includes an internal buffer such that data read from a first location within the flash memory is rewritten to a second location in the flash memory without the necessity for that data to be transferred out of the flash memory. This improves the data transfer time. However, this known technique does not provide for error checking and correction, but simply assumes that the data read from the first flash memory location is accurate.

What is needed is a method whereby the efficiency of the copy operation without data transfer latency can be used in such a way that the integrity of the data being copied can be verified.

SUMMARY

A non-volatile memory system is designed with circuitry that, after having read (sensed) the data from memory cells in one physically addressed location is subsequently used to program that data to a different physically addressed location. This improves the overall performance of the memory storage system by removing the latency suffered by the two data transfers out of and subsequently back into the memory circuit. During the program operation the data is additionally transferred to a control circuit so that data validity is verified. This further increases the overall performance of the system by allowing the data to be verified concurrent with the program operation without suffering decreased system reliability.

DETAILED DESCRIPTION

Figure 1:
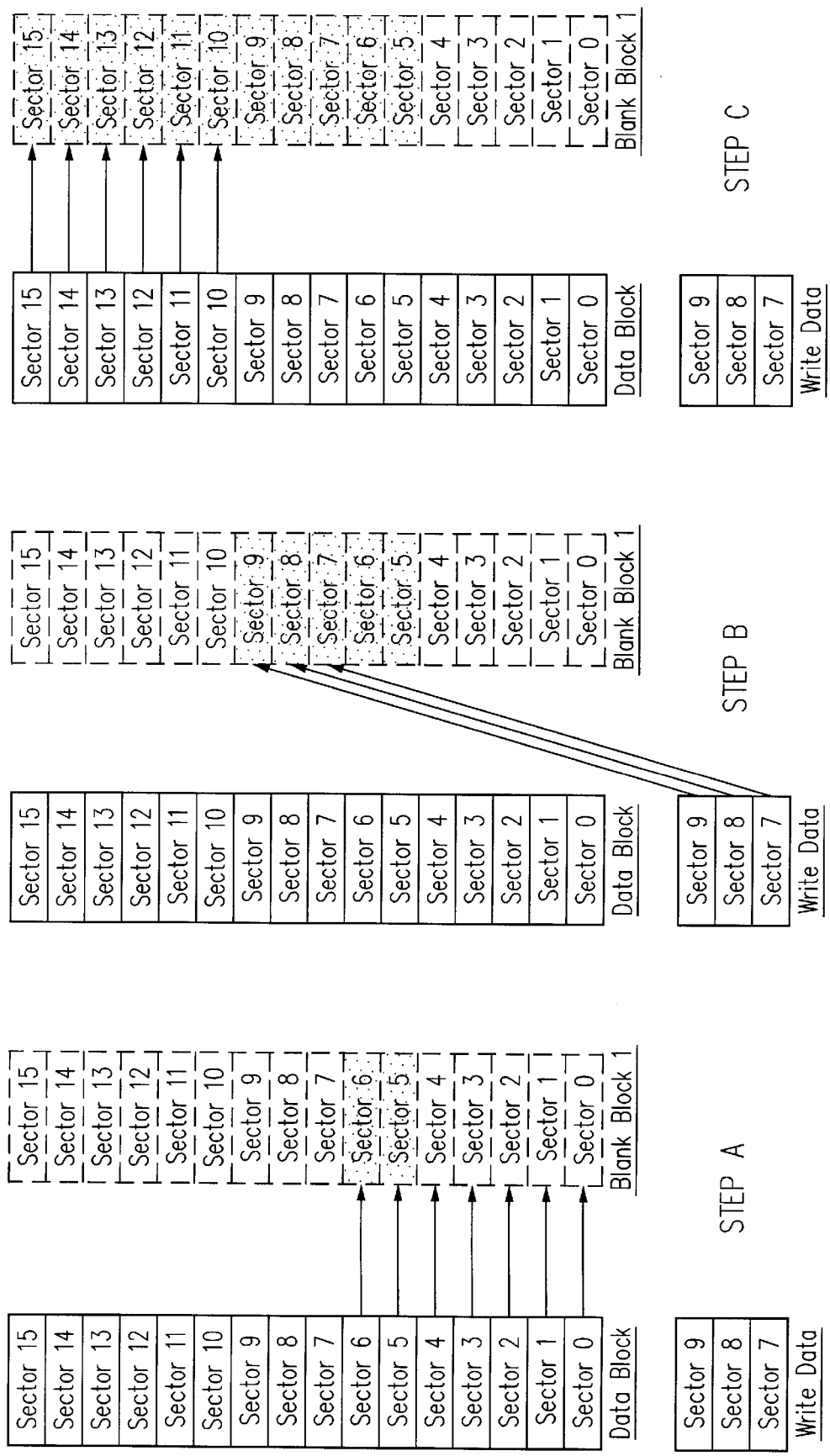
FIG. 1 shows the steps involved in writing new data to a logical address in a prior art EEPROM.
Figure 2:
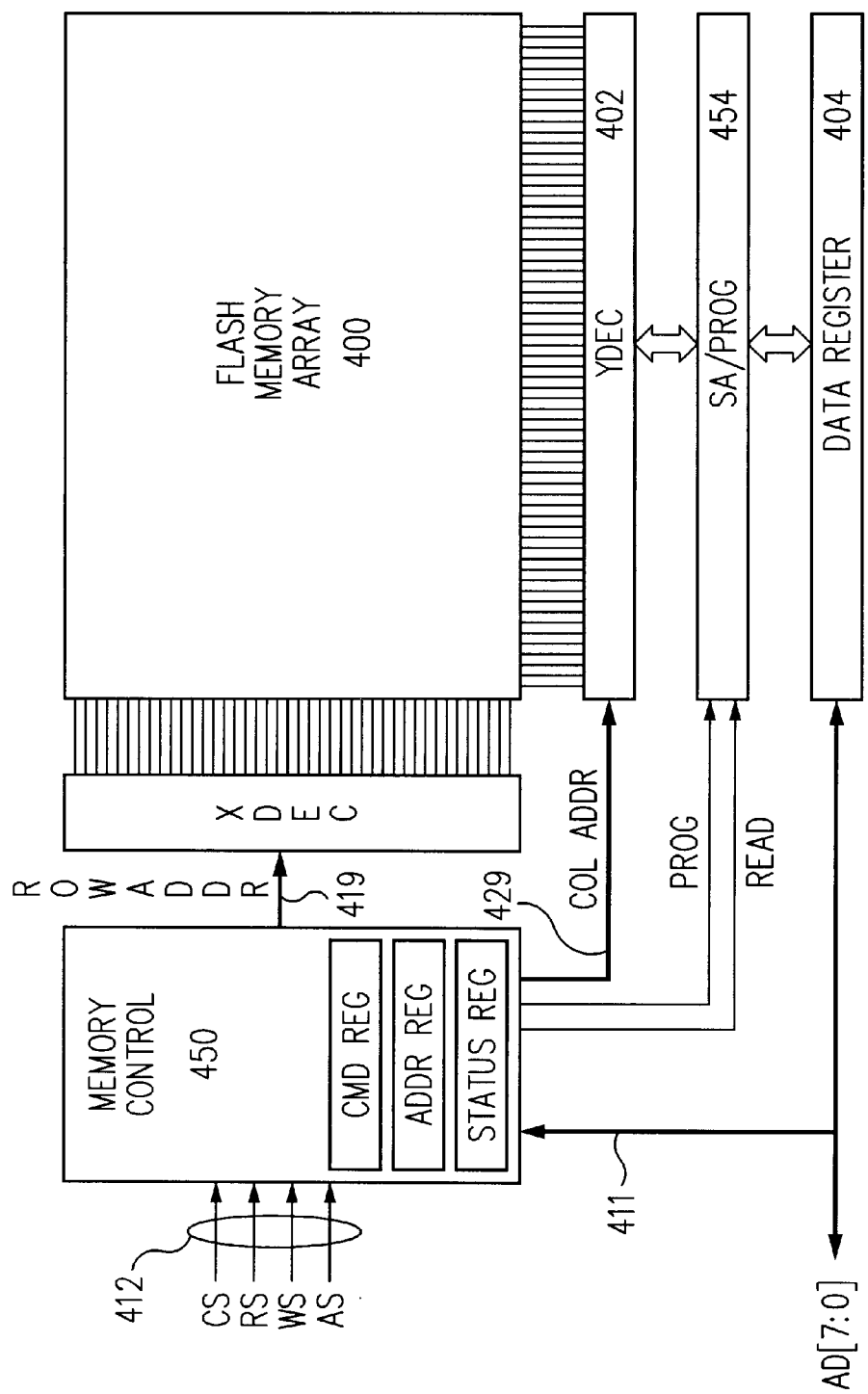
FIG. 2 shows a block diagram of a typical prior art EEPROM.
Figure 3:
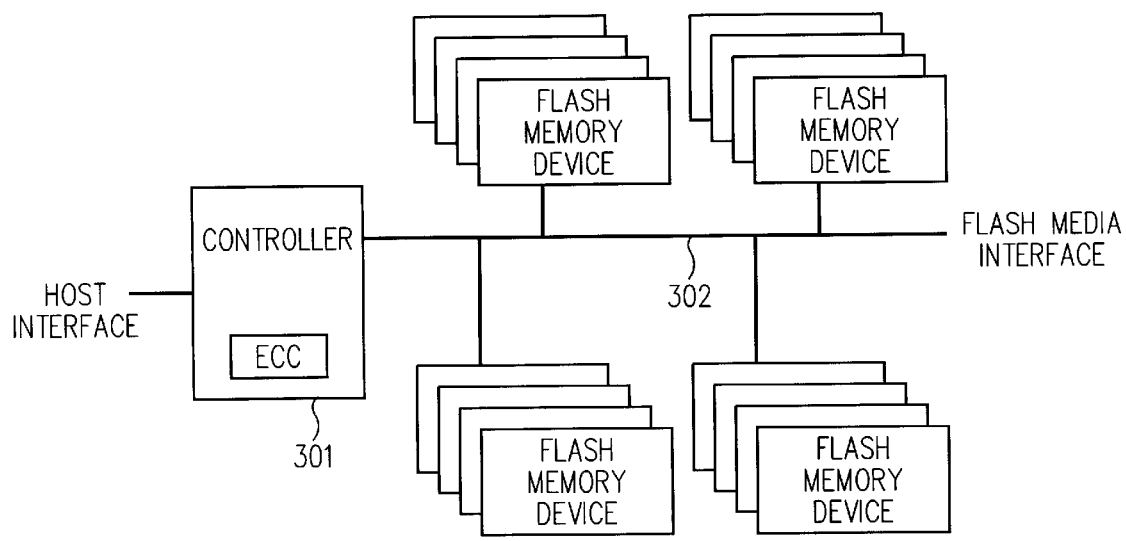
FIG. 3 shows a typical flash-based storage subsystem architecture of the prior art.
Figure 4:
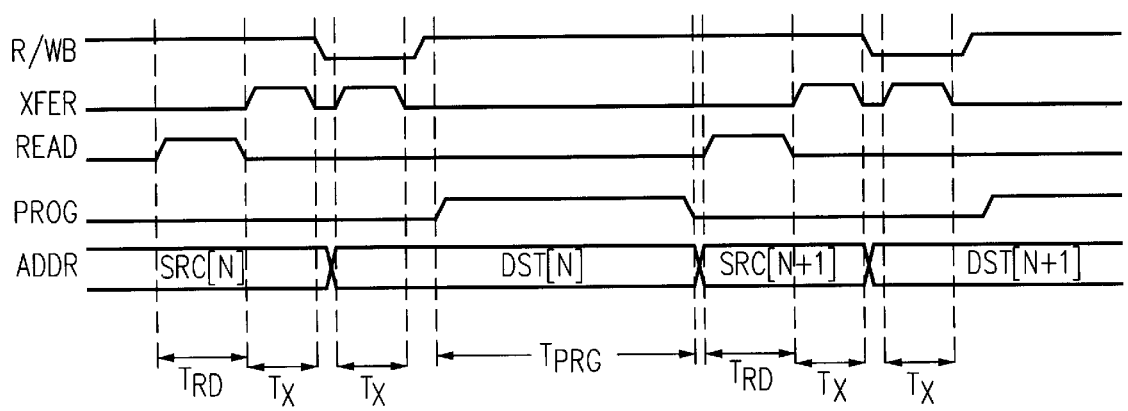
FIG. 4 shows a timing diagram of a page copy operation of the prior art.
Figure 5:
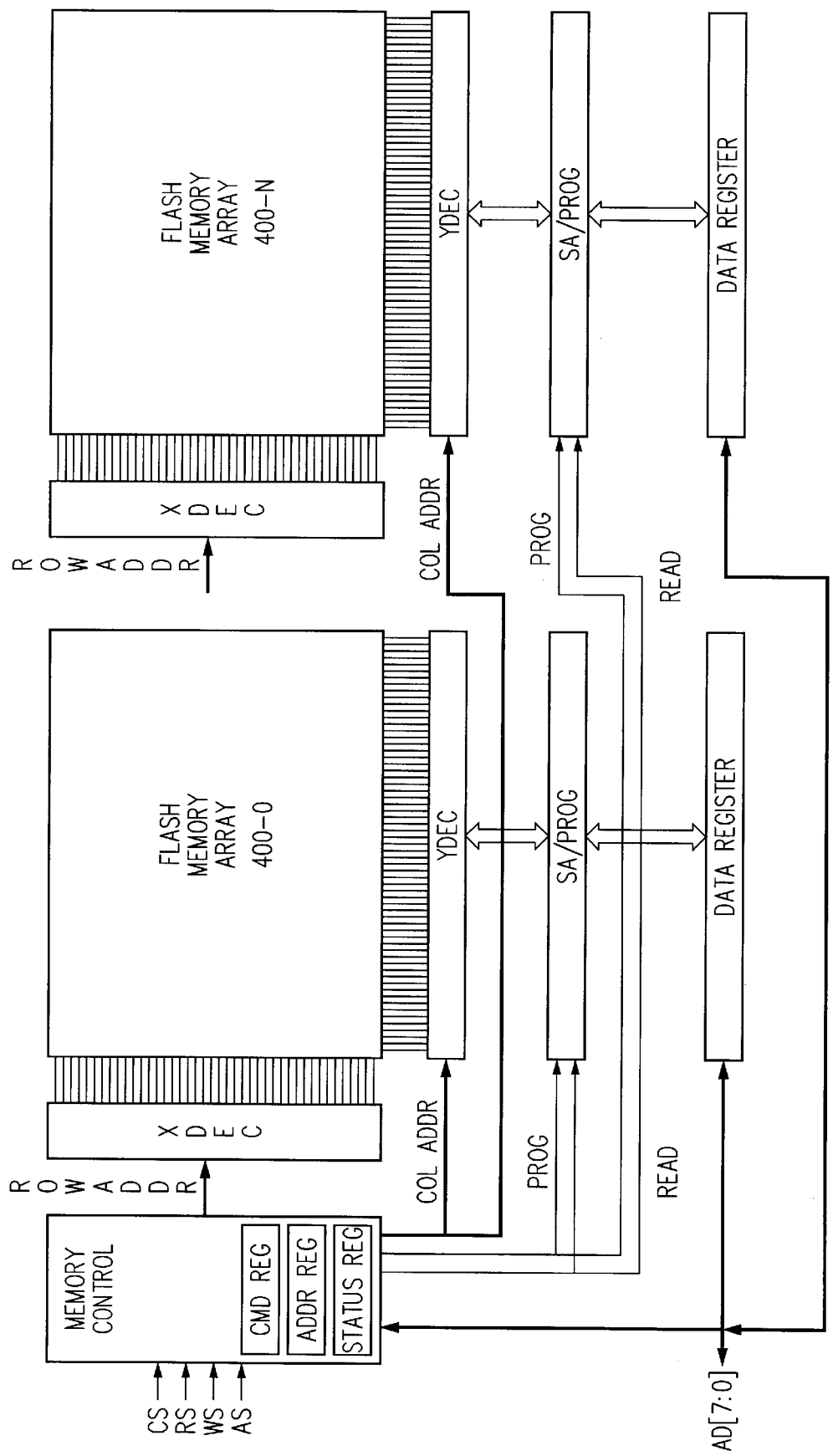
FIG. 5 shows a schematic representation of a semiconductor non-volatile memory according to one embodiment of the present invention.

FIG. 5 shows a diagram representing a semiconductor non-volatile memory that is constructed in accordance with one embodiment of this invention. The memory system shown consists of two separately addressed memory arrays 400-O and 400-N, each having associated circuitry for the purpose of addressing a particular wordline, sensing the threshold voltages of the cells on that wordline and storing the data sensed for later use, much as was described previously with respect to FIG. 2. The memory system also has, associated with each array, programming circuitry for the purpose of erasing a group of cells controlled by one or more wordlines and for the purpose of programming the cells along one of addressed wordlines. FIG. 5 shows a system with two separate arrays with their associated circuitry and a separate controller circuit, but it should be understood that this invention applies to memory system with any desired number of such arrays of non-volatile memory cells, and to systems in which the controller circuit is contained on the same semiconductor device as are one or more of the plurality of memory arrays.

In this invention, the circuitry for performing the storing of sensed data and for providing the programming data is designed in such a way that the memory element for both operations is physically the same. Thus, once data is read and stored in the sense data register, it can be used to control a program operation without the need for further data transfer.

The address mechanism is designed in such a way that after a read operation on a particular addressed wordline, the address may be changed to address a different wordline in the same array for the purposed of programming the latter wordline with the data from the sensed data register. Thus, this circuit contains everything necessary to perform an efficient copy operation from one wordline to another, without the need to send data outside of the memory device.

For the example where it is desired to rewrite new data in sector 7 through sector 9 of the 16 data block, the write sequence is as follows:

1. Assign unused block (erased block 1) for the sector write operation;
2. Select address of original block, read page 0 of original block into data register;
3. Select address of newly assigned block, begin program operation in newly assigned block. Simultaneously transfer data from data register to controller circuit in order to check data validity;
4. Check memory status register and data validity status. If error, invoke error recovery mechanism;
5. Repeat steps 2 though 4 for pages 1 through 6;
6. Select address of newly assigned block, transfer new data for page 7 from controller to flash EEPROM and begin program operation in newly assigned block;
7. Check memory status register. If error, invoke error recovery mechanism;
8. Repeat steps 6 and 7 for pages 8 and 9;
9. Select address of original block, read page 10 of original block into data register;
10. Select address of newly assigned block, begin program operation of page 10 in newly assigned block. Simultaneously transfer data from data register to controller circuit in order to check data validity;
11. Check memory status register and data validity status; and
12. Repeat steps 9 through 11 for pages 11 though 15. If error, invoke error recovery mechanism.

Figure 6:
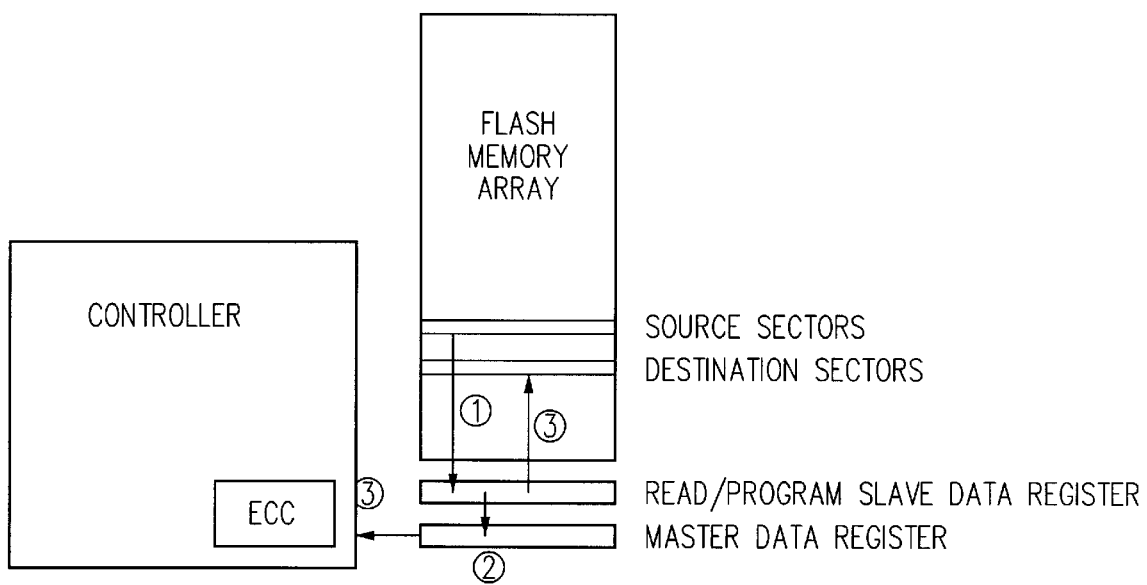
FIG. 6. illustrates the sequence of events that occur during a copy operation according to one embodiment of the present invention.

FIG. 6 illustrates the sequence of events that occur during a copy operation according to one embodiment of the present invention. The arrows indicate the direction of data flow during the read (1), Master to Slave register transfer (2), program (3) and data transfer (3). Data transfer and program operations both have a (3) indicating that they are parallel operations.

Because this memory is designed as one or more separate memory cell arrays, as many of these copy operations can be performed in parallel as there are separate memory arrays. This further increases the efficiency of the operation.

It does occasionally occur that data in one or more cells, once sensed, does not reflect the original data that was programmed into those cells. In such cases, it is desirable to verify the validity of those data by using an external circuit means of verification. In one embodiment, data redundancy is used, for example ECC, that is programmed simultaneously with the original data into a group of cells and that, when read from those cells, can verify the validity of that data. In cases where there is an error detected, that redundancy information may also be used to correct the erroneous data. The embodiment shown in FIG. 5 allows the data, once sensed, to be transferred to a circuit external to the memory circuit for the purpose of verification. This is implemented in such a way as to allow this transfer operation to occur without modifying the original sense data register contents. This then allows the transfer and verification operation to occur simultaneous to the program operation.

Since there are many separate memory cell arrays and since the time to perform program operation is significantly longer than the time to perform the transfer and verification, multiple program operations can be performed simultaneously with multiple transfer and verify operations. In this manner the validity of the data being programmed during the copy operation can be assured without a performance penalty. And by assuring the validity of the data, the system reliability is increased.

All publications and patent applications mentioned in this specification are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

What is claimed is:

1. A non-volatile memory system comprising:
   an array of non-volatile memory cells;
   a first register;
   a second register; and
   a controller circuit for reading data from said array, storing read data into said first and second registers, and simultaneously programming one or more locations of said array with data from said first register while checking the validity of data in said second register.

2. A system as in claim 1, wherein said controller causes data stored in said second register to be read out of said memory system while said programming occurs.

3. A system as in claim 1, wherein said memory cells comprise flash memory cells.

4. A system as in claim 1, which further comprises an ECC circuit to check the validity of said data in said second register.

5. A system as in claim 1, wherein said second register comprises a plurality of individual elements capable of being addressed and read while said programming occurs.

* * * * *